US009843285B1

(12) United States Patent
Lu

(10) Patent No.: US 9,843,285 B1
(45) Date of Patent: Dec. 12, 2017

(54) DIGITAL DEMODULATOR FOR PULSE-WIDTH MODULATED (PWM) SIGNALS IN A MOTOR CONTROLLER

(71) Applicant: Allegro MicroSystems, LLC, Worcester, MA (US)

(72) Inventor: Yisong Lu, Shrewsbury, MA (US)

(73) Assignee: Allegro MicroSystems, LLC, Worcester, MA (US)

( * ) Notice: Subject to any disclaimer, the term of this patent is extended or adjusted under 35 U.S.C. 154(b) by 32 days.

(21) Appl. No.: 15/216,891

(22) Filed: Jul. 22, 2016

(51) Int. Cl.
*G05B 11/28* (2006.01)
*H02P 27/08* (2006.01)
*H03K 7/08* (2006.01)
*H02P 6/17* (2016.01)

(52) U.S. Cl.
CPC .............. *H02P 27/08* (2013.01); *H02P 6/17* (2016.02); *H03K 7/08* (2013.01)

(58) Field of Classification Search
USPC ....... 318/599, 811, 400.17, 400.26, 801, 569
See application file for complete search history.

(56) References Cited

U.S. PATENT DOCUMENTS

| | | | | |
|---|---|---|---|---|
| 3,760,412 A | * | 9/1973 | Barnes | G06K 7/0166 |
| | | | | 329/312 |
| 4,139,870 A | * | 2/1979 | Tachi | G11B 20/1419 |
| | | | | 360/43 |
| 5,210,474 A | * | 5/1993 | Oswald | H02P 6/08 |
| | | | | 318/400.09 |
| 5,994,853 A | * | 11/1999 | Ribbe | A63H 30/04 |
| | | | | 318/16 |
| 8,638,053 B2 | | 1/2014 | Ng | |
| 8,729,841 B2 | | 5/2014 | Reynolds et al. | |
| 8,742,713 B2 | | 6/2014 | Ng | |
| 8,836,396 B2 | | 9/2014 | Zhang et al. | |
| 9,088,233 B2 | | 7/2015 | Alcorn et al. | |
| 9,300,235 B2 | | 3/2016 | Ng et al. | |
| 2015/0063434 A1 | * | 3/2015 | Sonntag | H04L 27/1563 |
| | | | | 375/238 |

OTHER PUBLICATIONS

Bresch et al., "About the Demodulation of PWM-Signals with Applications to Audio Amplifiers"; Magdeburg, Germany, *IEEE* 1998; pp. I-205-I-208 (4 pages).
Honda et al. "Application Note AN-1071-Class D Audio Amplifier Basics", International Rectifier, Feb. 8, 2005; 14 pages.
Karkl, Jim, "Active Low-Pass Filter Design", AAP Precision Ananlog; Texad Instruments; Sep. 2002; 24 pages.

\* cited by examiner

*Primary Examiner* — Jorge L Carrasquillo
(74) *Attorney, Agent, or Firm* — Daly, Crowley, Mofford & Durkee, LLP

(57) ABSTRACT

Described embodiments provide circuits, systems and methods for digitally demodulating a pulse-width modulated (PWM) signal in a motor control system. An electronic circuit of the motor control system includes an input to receive a speed demand signal that is a PWM signal having a duty cycle associated with a requested speed of a motor. A PWM demodulator demodulates the PWM signal and generates an N-bit digital speed value representative of the requested speed of the motor, where N is a positive integer. A motor driver generates, based at least in part upon the N-bit digital speed value, one or more control signals to operate the motor.

16 Claims, 8 Drawing Sheets

208''

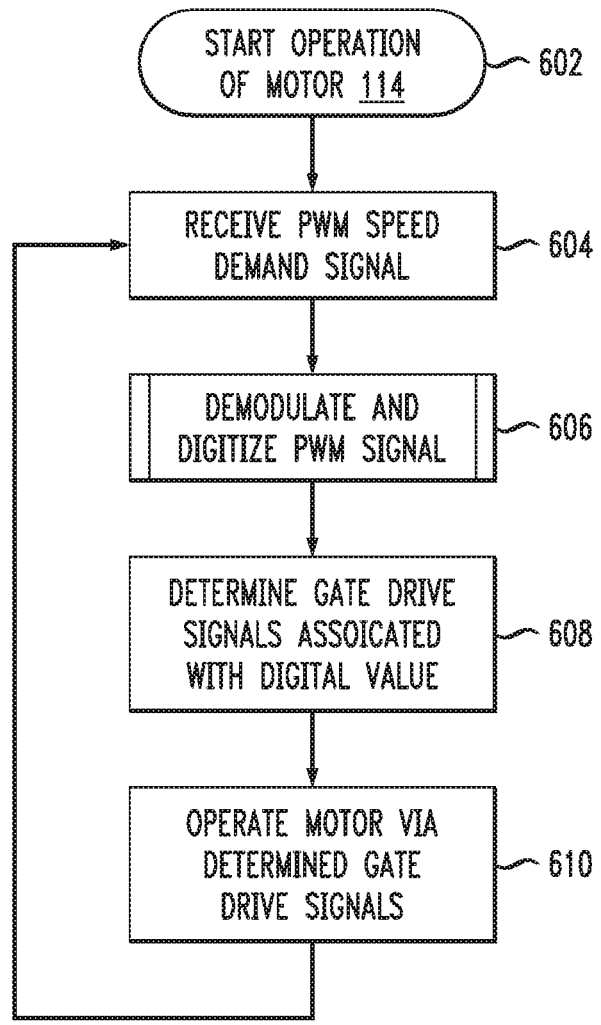

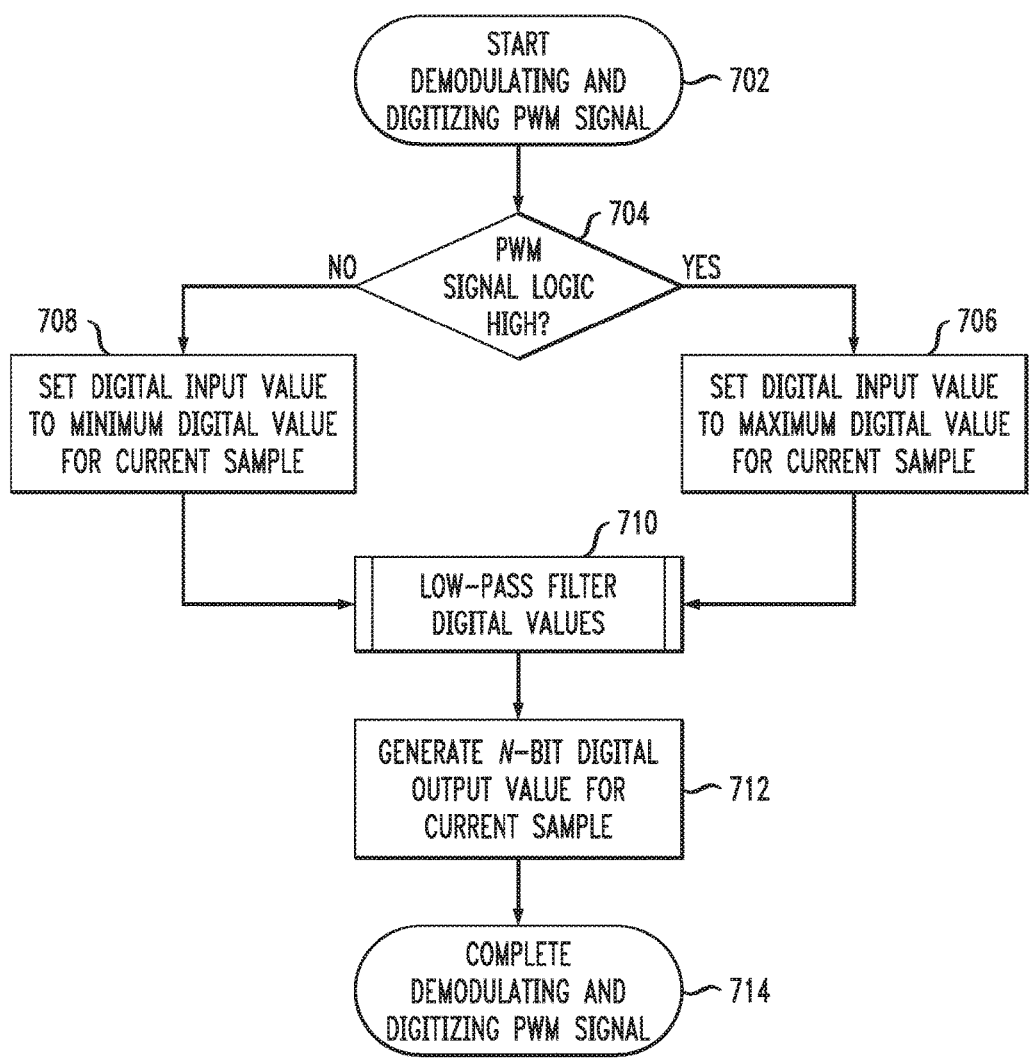

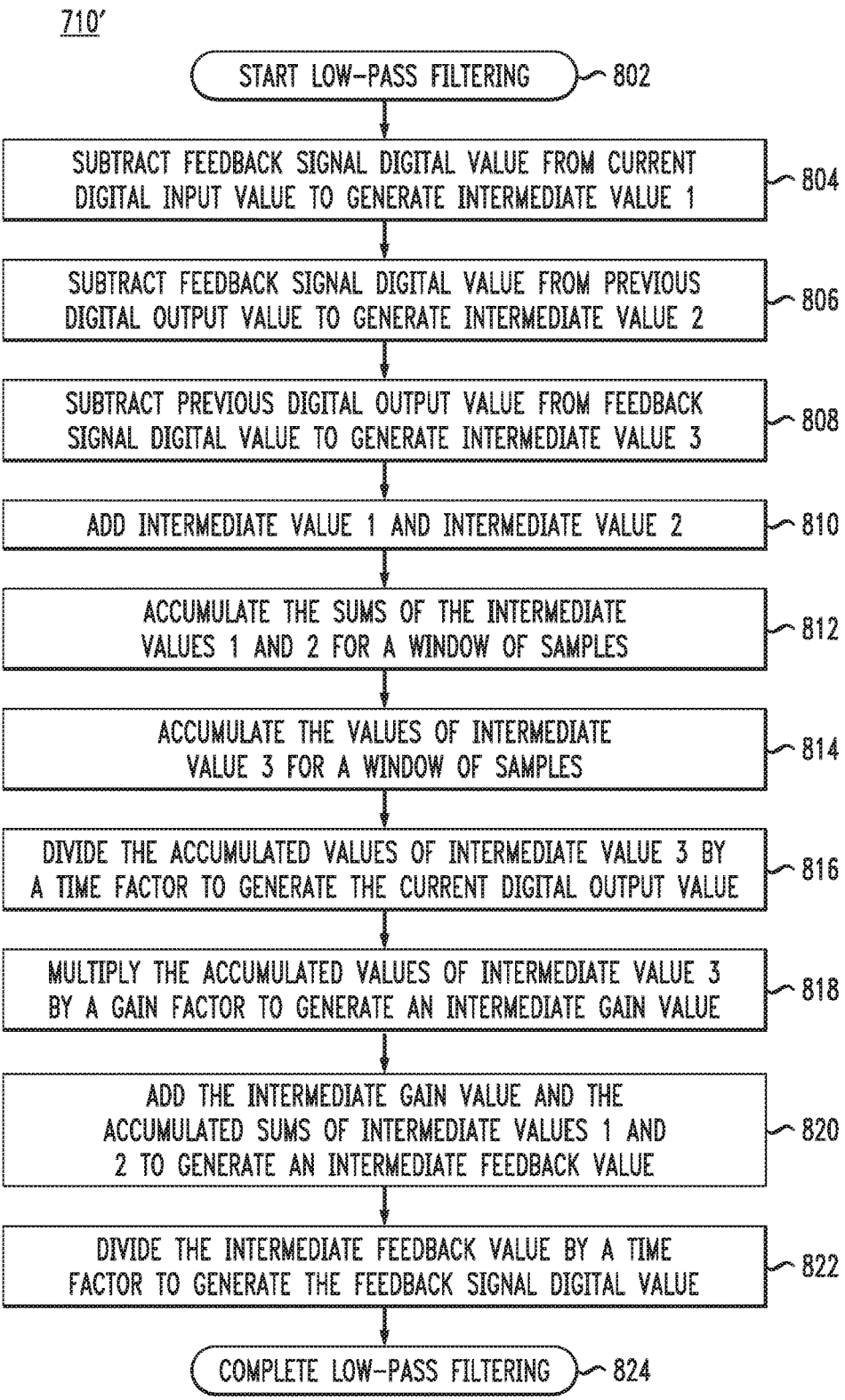

DIGITAL DEMODULATOR FOR PULSE-WIDTH MODULATED (PWM) SIGNALS IN A MOTOR CONTROLLER

BACKGROUND

Pulse-width modulated (PWM) signals are commonly used to control the current and/or voltage supplied to and, thus, the speed of, electric motors, such as brushless direct-current (BLDC) motors. Demodulating and digitizing PWM signals can be difficult, requiring complex and costly components (such as a digital signal processor (DSP) and/or analog-to-digital converter (ADC)), and/or components that may be physically large and difficult to implement in an integrated circuit (IC). Further, some PWM demodulation techniques may encounter difficulty generating a demodulated signal when the PWM signal has a duty cycle of 0% and/or 100%. Yet other solutions may require generating a local reference frequency to control a feedback network to demodulate the PWM signal. Further, in motor control systems, PWM control signals may be particularly noisy (e.g., have spurious signal spikes that could be, erroneously, included in a demodulated signal). Therefore, an improved technique for digital demodulation of PWM signals in a motor control system is needed.

SUMMARY

This Summary is provided to introduce a selection of concepts in a simplified form that are further described in the Detailed Description. This Summary is not intended to identify key features or essential features of the claimed subject matter, nor is it intended to be used to limit the scope of the claimed subject matter.

One aspect provides an electronic circuit for digitally demodulating a pulse-width modulated (PWM) signal in a motor control system. The electronic circuit includes an input to receive a speed demand signal that is a PWM signal having a duty cycle associated with a requested speed of a motor. A PWM demodulator demodulates the PWM signal and generates an N-bit digital speed value representative of the requested speed of the motor, where N is a positive integer. A motor driver generates, based at least in part upon the N-bit digital speed value, one or more control signals to operate the motor.

Another aspect provides a pulse-width modulated (PWM) signal demodulator. The PWM signal demodulator includes a multiplexer to select between a first digital value and a second digital value to provide a selected digital output value. The selection is based upon a logic level of a received PWM signal. The PWM signal demodulator also includes a digital low-pass filter to filter the selected digital output value to generate an N-bit digital value associated with a duty cycle of the received PWM signal. The low-pass filter includes a first input to receive the selected digital output value, a second input to receive a digital feedback value, an output to provide the N-bit digital value, and a feedback path to provide an adjusted N-bit digital value as the digital feedback value.

Another aspect provides a method for digitally demodulating a pulse-width modulated (PWM) signal in a motor control system. The method includes receiving a speed demand signal that is a PWM signal having a duty cycle associated with a requested speed of a motor coupled to the electronic circuit. The PWM signal is demodulated and an N-bit digital speed value representative of the requested speed of the motor is generated. N is a positive integer. Based at least in part upon the N-bit digital speed value, one or more control signals to operate the motor are generated. The PWM signal is demodulated by selecting between a first digital value and a second digital value to provide a selected digital output value, the selection based upon a logic level of the PWM signal. The selected digital output value is filtered to generate the N-bit digital speed value.

Another aspect provides a method for demodulating a pulse-width modulated (PWM) signal. The method includes selecting between a first digital value and a second digital value and providing a selected digital output value. The selection is based upon a logic level of a received PWM signal. The selected digital output value is filtered and an N-bit digital value associated with a duty cycle of the received PWM signal is generated. The N-bit digital value is generated based, at least in part, upon the selected digital output value and a digital feedback value. The digital feedback value is generated for a current sample of the selected digital output value by: subtracting the digital feedback value from the current selected digital output value to generate a first intermediate value; subtracting the digital feedback value from a previous N-bit digital speed value to generate a second intermediate value; subtracting the previous N-bit digital speed value from the digital feedback value to generate a third intermediate value and accumulate the third intermediate value for a window of X samples; adding the first intermediate value and the second intermediate value and accumulating the sums for a window of X samples as an accumulated sum value; multiplying the accumulated third intermediate values by a gain factor to generate an intermediate gain value; adding the intermediate gain value and the accumulated sum value to generate an intermediate feedback value; dividing the intermediate feedback value by a time factor to generate the digital feedback value; and dividing the accumulated third intermediate values by a time factor to generate the N-bit digital speed value.

BRIEF DESCRIPTION OF THE DRAWING FIGURES

Other aspects, features, and advantages of the claimed subject matter will become more fully apparent from the following detailed description, the appended claims, and the accompanying drawings in which like reference numerals identify similar or identical elements. Reference numerals that are introduced in the specification in association with a drawing figure might be repeated in one or more subsequent figures without additional description in the specification in order to provide context for other features.

FIG. 6 is a flow diagram showing an illustrative process for operating a motor in accordance with illustrative embodiments;

FIG. 7 is a flow diagram showing an illustrative process for demodulating a PWM signal in accordance with illustrative embodiments; and FIG. 8 is a flow diagram showing an illustrative process for low-pass filtering a digital signal in accordance with illustrative embodiments.

DETAILED DESCRIPTION

Described embodiments provide circuits, systems and methods for providing digital demodulation of a pulse-width modulated (PWM) signal to provide digital control of a motor.

Figure 1:
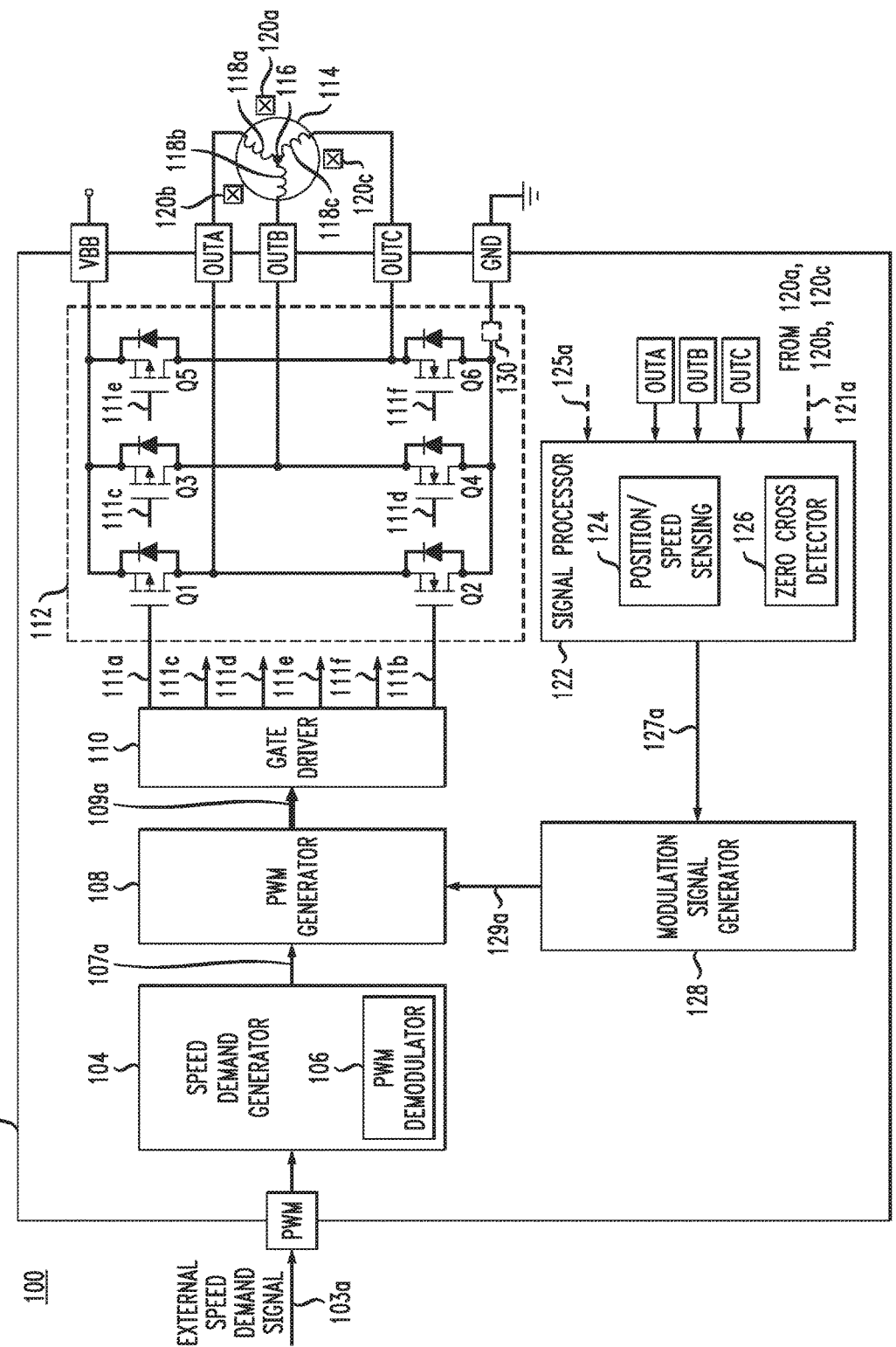
FIG. 1 is a schematic diagram showing a motor driver with a pulse-width modulated (PWM) signal demodulator in accordance with illustrative embodiments.

Referring to FIG. 1, a schematic of illustrative motor system 100 is shown. Motor system 100 includes motor driver 102 to control operation of multi-phase motor 114. Although shown in FIG. 1 as being a three-phase motor, in some embodiments, motor 114 could employ other numbers of phases, as would be understood by one of ordinary skill in the art. In some embodiments, motor driver 102 is an integrated circuit (IC). In some embodiments, motor 114 may be a brushless direct-current (BLDC) motor.

Motor driver 102 is coupled to receive external speed demand signal 103a from an external device coupled to motor driver 102. In general, external speed demand signal 103a is indicative of a requested speed of motor 114. In some embodiments, external speed demand signal 103a is a pulse-width modulated (PWM) signal, although in some embodiments, external speed demand signal 103a may be provided in one of a variety of other formats, for example, a Single Edge Nibble Transmission (SENT) format, a Serial Peripheral Interface (SPI) format, a Local Interconnect Network (LIN) format, a CAN (Controller Area Network) format, an Inter-Integrated Circuit (I2C) format, or other similar signal formats, and converted to a PWM signal for provision to speed demand generator 104.

Speed demand generator 104 receives external speed demand signal 103a and generates speed demand signal 107a. In some embodiments, speed demand signal 107a is determined not only by external speed demand signal 103a, but also motor current requirements measured or calculated by signal processor 122. Further, speed demand signal 107a may also be adjusted based upon properties of motor driver 102 and/or motor 114, such as an over current limit (OCL). For example, to protect against over current conditions, speed demand signal 107a may be clamped to a maximum value that may be less than requested by external speed demand signal 103a.

As shown in FIG. 1, speed demand generator 104 may include PWM demodulator 106. As described herein PWM demodulator 106 may demodulate a PWM signal (e.g., external speed demand signal 103a) and provide a digital output value (e.g., as speed demand signal 107a).

Pulse-width modulation (PWM) generator 108 is coupled to receive speed demand signal 107a and generate PWM signal 109a, a duty cycle of which is based upon speed demand signal 107a. PWM generator 108 is also coupled to receive modulation waveforms (e.g., signal 129a) from modulation signal generator 128. In some embodiments, PWM generator 108 generates PWM signal 109a with a modulation characteristic (i.e., a relative time-varying duty cycle) in accordance with the modulation waveforms (e.g., signal 129a) provided by modulation signal generator 128.

Gate driver 110 receives PWM signal 109a and generates PWM transistor drive signals 111a, 111b, 111c, 111d, 111e and 111f (collectively, transistor drive signals 111) to drive corresponding switching elements, shown as field effect transistors (FETs) Q1, Q2, Q3, Q4, Q5, and Q6. Together, transistors Q1 and Q2 form a half-bridge circuit that generates motor control signal OUTA corresponding to a first phase, A, of motor 114. Similarly, transistors Q3 and Q4 form a half-bridge circuit that generates motor control signal OUTB corresponding to a second phase, B, of motor 114, and transistors Q5 and Q6 form a half-bridge circuit that generates motor control signal OUTC corresponding to a third phase, C, of motor 114.

Although shown in FIG. 1 as employing motor 114 as a three-phase motor and motor driver 102 as including six corresponding switching elements, it is understood that any practical number of switching elements coupled in various suitable configurations can be used to provide signals to energize motor 114.

Although transistors Q1, Q2, Q3, Q4, Q5 and Q6 are shown as being an N-channel metal oxide semiconductor field effect transistors (MOSFETs), other types of switching elements may be employed, such as P-channel MOSFETs, bipolar junction transistors (BJTs), Silicon-Controlled Rectifiers (SCRs), thyristors, triacs, or other similar switching elements. When MOSFETs are employed, each transistor has a corresponding intrinsic body diode as shown in FIG. 1. Each body diode is arranged from drain (cathode) to source (anode) of the MOSFET, making the MOSFET able to block current in only one direction. The body diodes are thus frequently utilized as freewheeling diodes for inductive loads, such as motor 114, for example when the MOSFET is used as a switch in a half-bridge circuit.

The six transistors Q1, Q2, Q3, Q4, Q5 and Q6 are synchronized to operate in saturation to provide three motor drive signals OUTA, OUTB and OUTC to motor 114. In some embodiments, such as shown in FIG. 1, transistors Q1, Q2, Q3, Q4, Q5 and Q6 may be internal to motor driver 102. In other embodiments, transistors Q1, Q2, Q3, Q4, Q5 and Q6 may be external devices coupled to motor driver 102.

Motor driver 102 includes signal processor 122 which is coupled to receive at least one of the motor drive signals (e.g., at least one of OUTA, OUTB, and OUTC). Signal processor 122 may include position and speed sensing circuit 124 to determine a speed and/or a rotational reference position of motor 114 (e.g., an angular position of a moving element (rotor) of motor 114 relative to a stationary element (stator) of motor 114).

In some embodiments, signal processor 122 may include zero crossing detector 126 that generates at least one signal indicative of a zero crossing of one or more of the windings of motor 114.

When motor 114 is a three-phase motor, the motor includes three windings, shown as windings 118a, 118b and 118c, each of which, as would be understood by one of skill in the art, can be depicted as an equivalent circuit having an inductor in series with a back electromotive force (EMF) voltage source (not shown). As shown in FIG. 1, each winding 118a, 118b and 118c is joined in a Y configuration at a common point shown as center tap 116. The voltage of the back EMF voltage source is directly observable when the current through the associated motor winding is zero. Thus, zero crossing information might beneficially be employed to determine back EMF and, therefore, also a direction of motion and position of motor 114.

The back EMF for each winding is a voltage opposing the voltage of the motor control signals (e.g., OUTA, OUTB, and OUTC) that is proportional to the speed of the motor. Knowing when back EMF zero crossing points occur is indicative of an angular position of motor 114 (e.g., of a position of a moving element (rotor) of motor 114 relative to a stationary element (stator) of motor 114). Some embodiments may alternatively or additionally employ optional Hall effect elements or other magnetic field sensing elements, shown as sensing elements 120a, 120b and 120c, disposed within motor 114 to detect the rotational position of motor 114. Signals from the sensing elements 120a, 120b and 120c may be provided to signal processor 122 as sensor signals 121a. Some embodiments may alternatively or additionally employ an optional current sensor 130 to determine current through motor 114. Signals from the current sensor may be provided to signal processor 122 and current sense signal 125a.

Modulation signal generator 128 is coupled to receive a speed reference signal and/or a position reference signal 127a from signal processor 122. In some embodiments, modulation signal generator 128 can modify modulation waveforms (e.g., signal 129a) to PWM generator 108 based, at least in part, upon speed reference signal and/or a position reference signal 127a. Thus, in some embodiments, motor driver 102 can automatically adjust a timing (i.e., a phase) of the transistor drive signals 111 in relation to a sensed rotational position and sensed rotational frequency of motor 114 (e.g., signal 127a) and a requested speed of motor 114 (e.g., speed demand signal 107a).

Some embodiments of motor driver 102 might also provide for driving motor 114 in a phase advance mode to reduce a back electromotive force of the motor and align a phase of the current through motor 114 and a phase of a voltage applied to motor 114 (e.g., align a phase of the current of motor drive signals OUTA, OUTB and OUTC and a phase of the voltage of motor drive signals OUTA, OUTB and OUTC, respectively).

Motor driver 102 receives a power supply voltage VBB, which is also supplied to motor 114 through transistors Q1, Q3 and Q5 during times when transistors Q1, Q3 and Q5 are turned on. Motor driver 102 also receives a ground (or circuit common) supply voltage GND, which is supplied to motor 114 through transistors Q2, Q4 and Q6 during times when transistors Q2, Q4 and Q6 are turned on. It will be understood that there can be a small voltage drop (for example, 0.1 volts) through transistors Q1, Q2, Q3, Q4, Q5 and Q6 when they are turned on and supplying current to motor 114.

Current is provided to motor 114 by turning on an upper transistor (e.g., one of transistors Q1, Q3 and Q5) in a given half-bridge circuit to couple supply voltage VBB though the upper transistor to motor 114, and turning on a lower transistor (e.g., one of transistors Q2, Q4 and Q6) in another half-bridge circuit to couple ground voltage GND though the lower transistor to motor 114, allowing current to flow through one or more corresponding windings of motor 114. For example, if upper transistor Q1 is turned on (e.g., control signal 111a is logic high), then one of lower transistors Q4 and Q6 could be turned on (e.g., one of control signals 111d or 111f is logic high) to allow a current to flow through associated windings of motor 114 (e.g., windings 118a and 118b, or windings 118a and 118c).

To prevent short circuit (or "shoot through") conditions, only one transistor in each half-bridge circuit can be turned on at a given time. As a precaution, gate driver circuit 110 might control transistor drive signals 111 such that for short periods of time after one of the transistors of a given half-bridge circuit turns off, the other transistor cannot turn on and, thus, both transistors are off. This time is commonly known as "dead time" of the half-bridge circuit. For the illustrative system shown in FIG. 1, during dead time for each half-bridge circuit, the upper transistor (e.g., transistors Q1, Q3 and Q5) and the lower transistor (e.g., transistors Q2, Q4 and Q6) are both off (e.g., transistor drive signals 111a and 111b are both logic low, transistor drive signals 111c and 111d are both logic low, and transistor drive signals 111e and 117f are both logic low).

Figure 2:
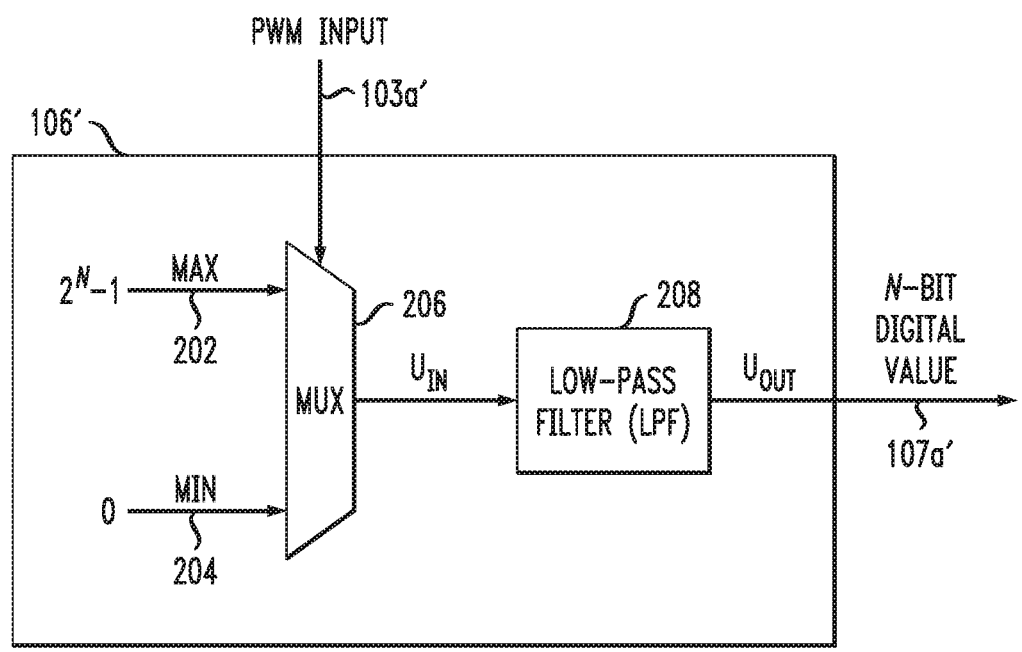
FIG. 2 is a block diagram of the PWM signal demodulator of the motor driver of FIG. 1 in accordance with illustrative embodiments.

Referring to FIG. 2, additional detail of PWM demodulator 106 is shown as PWM demodulator 106'. PWM demodulator 106' receives external speed demand signal 103a', which is a PWM signal, and generates speed demand signal 107a' as an N-bit digital signal. As shown, PWM demodulator 106' may include multiplexer (MUX) 206 and low-pass filter (LPF) 208. MUX 206 has a first input, 202, coupled to receive a first predetermined digital value, MAX. In some embodiments, the digital value of MAX may be a maximum digital value of PWM demodulator 106'. For example, if speed demand signal 107a' is an N-bit digital signal, a maximum value of the N-bit signal is $2^N-1$. For example, in an 8-bit system, MAX might be equal to 255. MUX 206 has a second input, 204, coupled to receive a second predetermined digital value, MIN. In some embodiments, the digital value of MIN may be a minimum digital value of PWM demodulator 106'. For example, if speed demand signal 107a' is an N-bit digital signal, a minimum value of the N-bit signal is 0. Thus, in digital values, a PWM duty cycle of 0% (e.g., of external speed demand signal 103a') corresponds to MIN, and a PWM duty cycle of 100% corresponds to MAX.

MUX 206 selects between the MAX and MIN values based upon a logic level of external speed demand signal 103a'. For example, if external speed demand signal 103a' is a logic high value, MUX 206 may provide the MAX value as signal $U_{IN}$, and if external speed demand signal 103a' is a logic low value, MUX 206 may provide the MIN value as signal $U_{IN}$. The $U_{IN}$ signal is an N-bit digital value that varies between the values of MAX and MIN based upon the input PWM signal (e.g., external speed demand signal 103a'). LPF 208 receives the UIN signal and filters it to provide the $U_{OUT}$ signal as a filtered N-bit digital value, which is output from PWM demodulator 106' as speed demand signal 107a'.

In some embodiments, LPF 208 may be implemented as a digital voltage-controlled voltage-source (VCVS) low-pass filter. An analog VCVS filter uses a super-unity-gain voltage amplifier with high input impedance and low output impedance to implement a 2-pole (e.g., approximately 40 dB/decade) low-pass, high-pass, or bandpass response. Described embodiments may employ a digital circuit to implement LPF 208. For example, in systems where N is equal to 8, described embodiments may set a zero band frequency of LPF 208 as the frequency where the input signal amplitude is attenuated by approximately 256 (−46 dB) so that the ripple of the output affected by input PWM frequency is less than 1 bit. LPF 208 is described in greater detail in regard to FIGS. 3 and 4.

Figure 3:
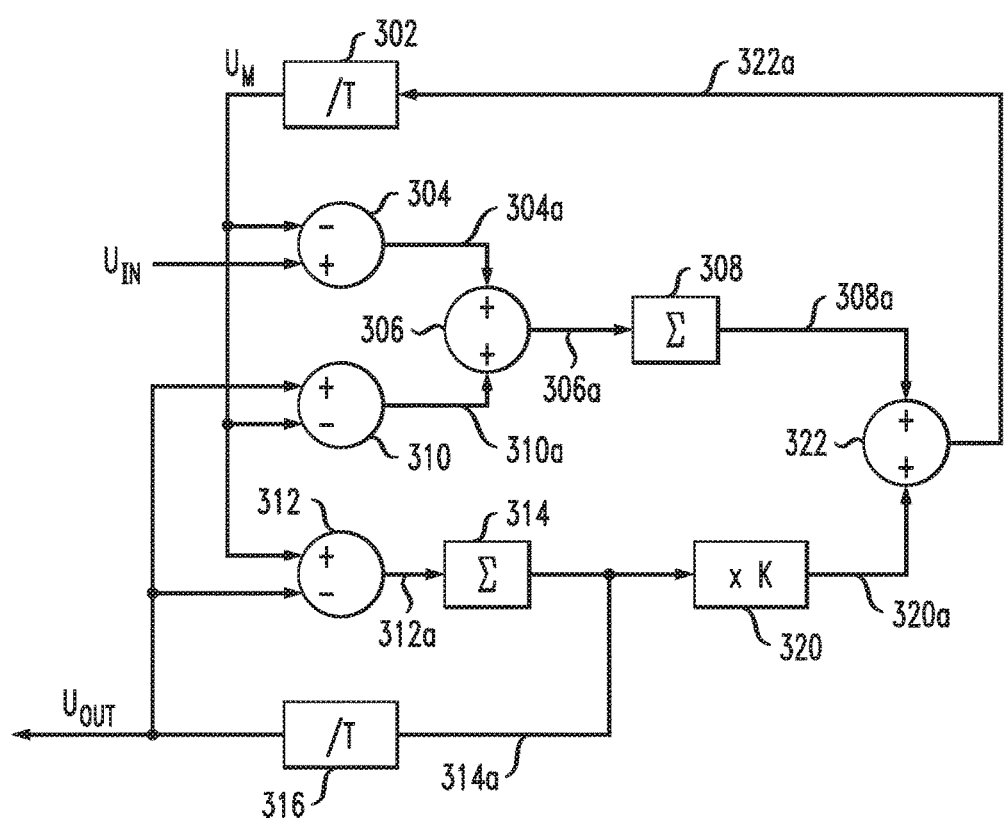
FIG. 3 is a block diagram of the filter of the PWM signal demodulator of FIG. 2 in accordance with illustrative embodiments.

Referring to FIG. 3, an illustrative embodiment of LPF 208 is shown as LPF 208'. As shown in FIG. 3, LPF 208' may include subtractors 304, 310 and 312, adders 306 and 322, accumulators 308 and 314, dividers 302 and 316, and multiplier 320. LPF 208' receives the N-bit digital $U_{IN}$ signal at subtractor 304, and subtracts an N-bit digital feedback signal, $U_M$, from $U_{IN}$, to generate first intermediate value 304a. Subtractor 310 subtracts feedback signal $U_M$ from the filtered N-bit digital value, $U_{OUT}$, to generate second intermediate value 310a. Adder 306 adds first intermediate value 304a and second intermediate value 310a to generate summed value 306a. The values of summed value 306a are accumulated by accumulator 308 for a determined number of samples (e.g., a determined number of summed values 306a) to generate accumulated value 308a. Subtractor 312 subtracts the filtered N-bit digital value, $U_{OUT}$, from feedback signal $U_M$ to generate third intermediate value 312a. The values of third intermediate value 312a are accumulated by accumulator 314 for a determined number of samples (e.g., a determined number of intermediate values 312a) to generate accumulated value 314a. Multiplier 320 multiplies accumulated value 314a by a gain factor, K, to generate intermediate gain value 320a. Adder 322 adds intermediate gain value 320a and accumulated value 308a to generate intermediate feedback signal 322a. Divider 302 divides intermediate feedback signal 322a by a time constant, T, to generate feedback signal $U_M$. Divider 316 divides accumulated value 314a by a time constant, T, to generate the filtered N-bit digital value, $U_{OUT}$, which is output from PWM demodulator 106' as speed demand signal 107a'.

Figure 4:
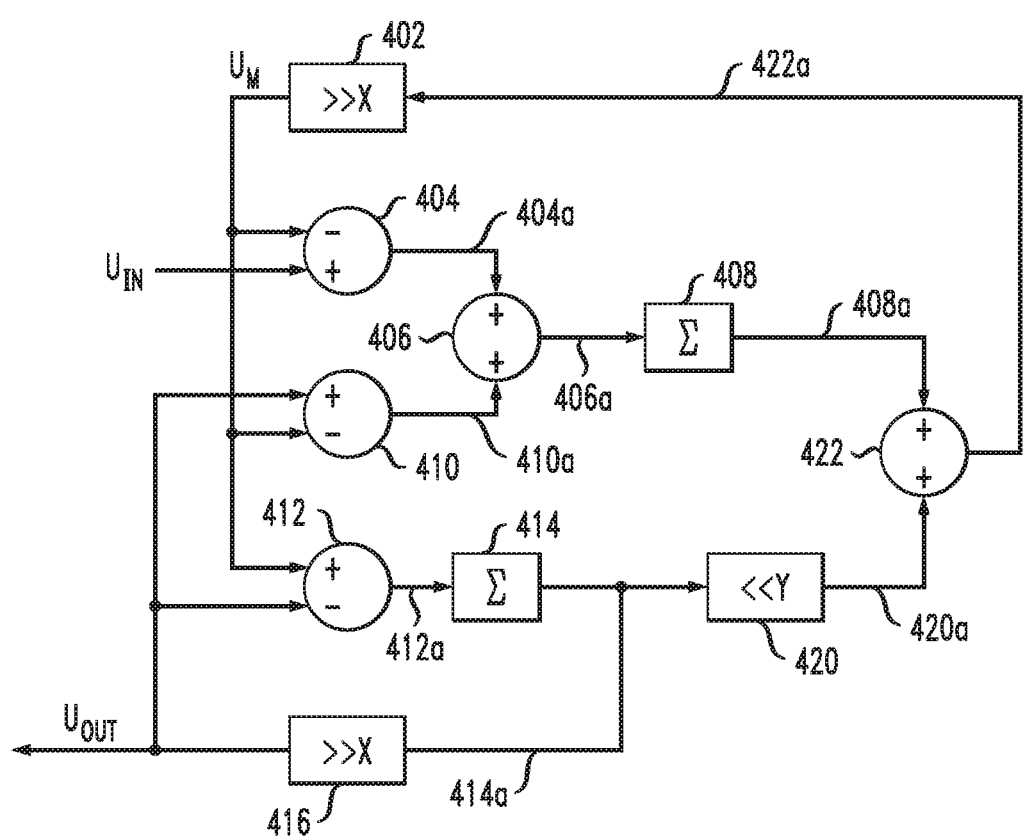
FIG. 4 is another block diagram of the filter of the PWM signal demodulator of FIG. 2 in accordance with illustrative embodiments.

Referring to FIG. 4, another illustrative embodiment of LPF 208 is shown as LPF 208". As shown in FIG. 4, LPF 208" may implement dividers 402 and 416 as right shift modules, and may implement multiplier 420 as a left shift module. For example, division by $2^X$ may be performed by right shifting the N-bit digital value by X bit positions. Similarly, multiplication by $2^Y$ may be performed by left shifting the N-bit digital value by Y bit positions.

In the embodiment shown in FIG. 4, X determines the cutoff frequency and the zero band frequency of LPF 208". The value of K may be selected to have fast response, avoid overshooting, and provide ease of implementation in a binary digital circuit. For example, in some embodiments, K may be equal to 1.25.

Figure 5A:
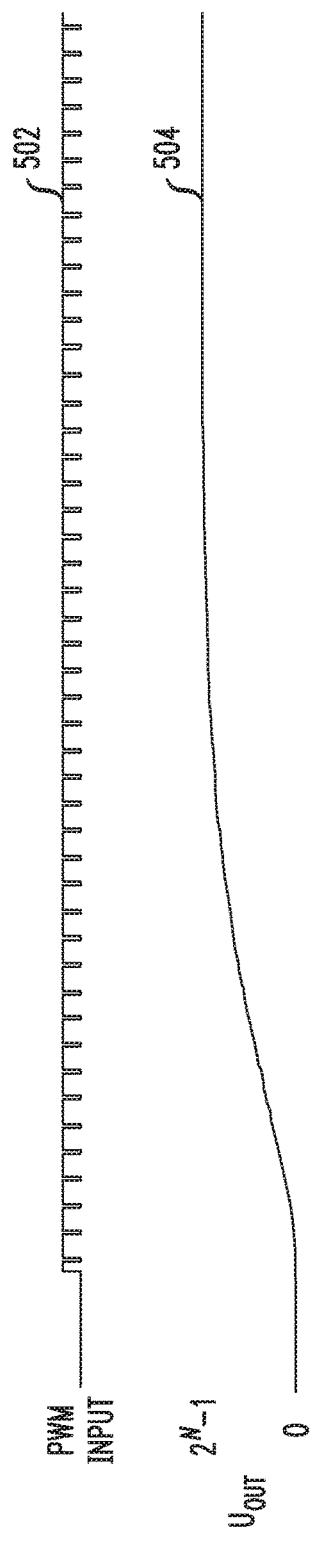
FIGS. 5A and 5B are timing diagrams showing illustrative signals of the PWM demodulator of FIG. 2 in accordance with illustrative embodiments.

FIG. 5A shows a plot of the PWM input signal (waveform 502) and the N-bit digital output signal, $U_{OUT}$, (waveform 504) over time. As shown in FIG. 5A, the PWM input signal starts with a 0% duty cycle, and increases to a 90% duty cycle. Correspondingly, $U_{OUT}$ starts with a value of 0, and increases over time to a value of approximately 90% of $2^N-1$. For example, for the illustrative operating conditions of FIG. 5A, N is 8, $2^N-1$ is 255, and $U_{OUT}$ reaches a digital value of approximately 230.

Figure 5B:
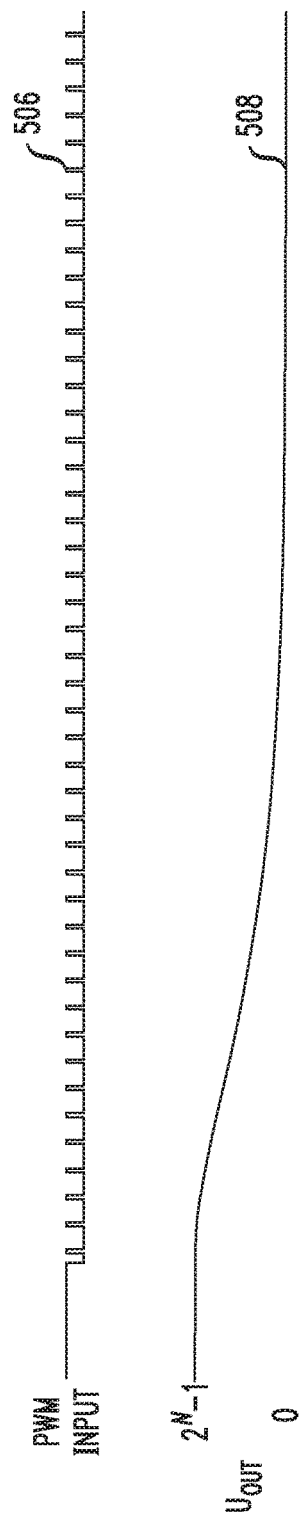

FIG. 5B shows a plot of the PWM input signal (waveform 506) and the N-bit digital output signal, $U_{OUT}$, (waveform 508) over time. As shown in FIG. 5B, the PWM input signal starts with a 100% duty cycle, and decreases to a 10% duty cycle. Correspondingly, $U_{OUT}$ starts with a value of $2^N-1$, and decreases over time to a value of approximately 10% of $2^N-1$. For example, for the illustrative operating conditions of FIG. 5B, N is 8, $2^N-1$ is 255, and $U_{OUT}$ reaches a digital value of approximately 25. In both FIGS. 5A and 5B, the PWM input signal may have a frequency of 2.5 kHz.

FIG. 6 shows a flow diagram of process 600 to operate motor 114 by motor driver 102. At block 602, operation of motor 114 begins. At block 604, a PWM speed demand signal is received (e.g., motor control 102 receives external speed demand signal 103a). At block 606, the PWM signal is demodulated and digitized (e.g., by PWM demodulator 106) into an N-bit digital value. Block 606 is described in greater detail in regard to FIG. 7. At block 608, the gate drive signals (e.g., transistor drive signals 111) associated with the N-bit digital value are determined. At block 610, motor 114 is operated based on the gate drive signals determined at block 608 (e.g., switching elements Q1, Q2, Q3, Q4, Q5, and Q6 are driven based upon transistor drive signals 111 to provide power to motor 114). Process 600 may return to block 604 to continue to receive a PWM speed demand signal, for example, until system 100 is powered off.

FIG. 7 shows additional detail of block 606 of FIG. 6, shown as process 606'. At block 702, process 606' begins. At block 704, if the PWM signal is a logic high value (e.g., if external speed demand signal 103a is logic high), then at block 706, the digital input value to the low-pass filter is set to a maximum digital value for the current sample of the PWM signal (e.g., MUX 206 of FIG. 2 provides MAX as signal $U_{IN}$ for a current sample of external speed demand signal 103a). At block 704, if the PWM signal is a logic low value (e.g., if external speed demand signal 103a is logic low), then at block 708, the digital input value to the low-pass filter is set to a minimum digital value for the current sample of the PWM signal (e.g., MUX 206 of FIG. 2 provides MIN as signal $U_{IN}$ for a current sample of external speed demand signal 103a).

At block 710, signal $U_{IN}$ is low-pass filtered (e.g., by LPF 208 of FIG. 2). Block 710 is described in greater detail in regard to FIG. 8. At block 712, the N-bit digital output value, $U_{OUT}$, is generated for the current sample of the PWM signal (e.g., external speed demand signal 103a). At block 714, process 606' completes.

FIG. 8 shows additional detail of block 710 of FIG. 7, shown as process 710'. At block 802, low-pass filtering begins (e.g., by LPF 208 of FIG. 2). At block 804, the low-pass filter subtracts an N-bit digital feedback signal, $U_M$, from the N-bit digital input signal $U_{IN}$ to generate a first intermediate value (e.g., intermediate value 304a of FIG. 3). At block 806, feedback signal $U_M$ is subtracted from the filtered N-bit digital value, $U_{OUT}$, to generate a second intermediate value (e.g., intermediate value 310a). At block 808, the filtered N-bit digital value, $U_{OUT}$, is subtracted from feedback signal $U_M$ to generate a third intermediate value (e.g., intermediate value 312a).

At block 810, the first intermediate value and the second intermediate value are added (e.g., summed value 306a). At block 812, the summed values are accumulated for a determined number of samples (e.g., a window of samples) to generate an accumulated value (e.g., accumulated value 308a). At block 814, the values of the third intermediate value are accumulated for a determined number of samples (e.g., a window of samples) to generate an accumulated value (e.g., accumulated value 314a). At block 816, the accumulated value of the third intermediate value is divided by a time constant, T, to generate the filtered N-bit digital value, $U_{OUT}$, which is output from PWM demodulator 106 as speed demand signal 107a. At block 818, the accumulated value of the third intermediate value is multiplied by a gain factor, K, to generate an intermediate gain value (e.g., intermediate gain value 320a). At block 820, the intermediate gain value is added to the accumulated value 308a to generate an intermediate feedback signal (e.g., intermediate feedback signal 322a). At block 822, the intermediate feedback signal is divided by a time constant, T, to generate feedback signal $U_M$. At block 824, low-pass filtering process 710' completes.

In some embodiments, motor driver 102 may include a processor. As used herein, the term "processor" describes an electronic circuit that performs a function, an operation, or a sequence of operations. The function, operation, or sequence of operations can be hard coded into the electronic circuit or soft coded by way of instructions held in a memory device. A "processor" can perform the function, operation, or sequence of operations using digital values or using analog signals. In some embodiments, the "processor" can be embodied in an application specific integrated circuit (ASIC). In some embodiments, the "processor" can be embodied in a microprocessor with associated program memory. In some embodiments, the "processor" can be embodied in a discrete electronic circuit. The "processor" can be analog, digital or mixed-signal.

Various functions of circuit elements may also be implemented as processing blocks in a software program. Such software may be employed in, for example, a digital signal processor, microcontroller, or general purpose computer. Thus, described embodiments may be implemented in hardware, a combination of hardware and software, software, or software in execution by one or more processors.

Some embodiments may be implemented in the form of methods and apparatuses for practicing those methods. Described embodiments may also be implemented in the form of program code, for example, stored in a storage medium, loaded into and/or executed by a machine, or transmitted over some transmission medium or carrier, such as over electrical wiring or cabling, through fiber optics, or via electromagnetic radiation. A non-transitory machine-readable medium may include but is not limited to tangible media, such as magnetic recording media including hard drives, floppy diskettes, and magnetic tape media, optical recording media including compact discs (CDs) and digital versatile discs (DVDs), solid state memory such as flash memory, hybrid magnetic and solid state memory, non-volatile memory, volatile memory, and so forth, but does not include a transitory signal per se. When embodied in a non-transitory machine-readable medium, and the program code is loaded into and executed by a machine, such as a computer, the machine becomes an apparatus for practicing the method.

When implemented on a processing device, the program code segments combine with the processor to provide a unique device that operates analogously to specific logic circuits. Such processing devices may include, for example, a general purpose microprocessor, a digital signal processor (DSP), a reduced instruction set computer (RISC), a complex instruction set computer (CISC), an application specific integrated circuit (ASIC), a field programmable gate array (FPGA), a programmable logic array (PLA), a microcontroller, an embedded controller, a multi-core processor, and/or others, including combinations of the above. Described embodiments may also be implemented in the form of a bitstream or other sequence of signal values electrically or optically transmitted through a medium, stored magnetic-field variations in a magnetic recording medium, etc., generated using a method and/or an apparatus as recited in the claims.

Various elements, which are described in the context of a single embodiment, may also be provided separately or in any suitable subcombination. It will be further understood that various changes in the details, materials, and arrangements of the parts that have been described and illustrated herein may be made by those skilled in the art without departing from the scope of the following claims.

I claim:

1. An electronic circuit for digitally demodulating a pulse-width modulated (PWM) signal in a motor control system, the electronic circuit comprising:
   an input configured to receive a speed demand signal, the speed demand signal comprising a PWM signal, wherein a duty cycle of the PWM signal is associated with a requested speed of a motor coupled to the electronic circuit;
   a PWM demodulator configured to demodulate the PWM signal and generate an N-bit digital speed value representative of the requested speed of the motor, wherein N is a positive integer;
   a motor driver configured to generate, based at least in part upon the N-bit digital speed value, one or more control signals to operate the motor;
   a multiplexer configured to select between a first digital value and a second digital value to provide a selected digital output value, the selection based upon a logic level of the PWM signal; and
   a digital low-pass filter configured to filter the selected digital output value to generate the N-bit digital speed value, wherein for a current sample of the selected digital output value, the low-pass filter is configured to:
   subtract a digital feedback value from the current selected digital output value to generate a first intermediate value;
   subtract the digital feedback value from a previous N-bit digital speed value to generate a second intermediate value;
   subtract the previous N-bit digital speed value from the digital feedback value to generate a third intermediate value and accumulate the third intermediate value for a window of Xsamples, wherein X is a positive integer;
   add the first intermediate value and the second intermediate value and accumulate the sums for a window of Xsamples as an accumulated sum value;
   multiply the accumulated third intermediate values by a gain factor to generate an intermediate gain value;
   add the intermediate gain value and the accumulated sum value to generate an intermediate feedback value;
   divide the intermediate feedback value by a time factor to generate the digital feedback value; and
   divide the accumulated third intermediate values by a time factor to generate the N-bit digital speed value.

2. The electronic circuit of claim 1, wherein the first digital value and the second digital value are N-bit values, wherein the first digital value is a minimum value, zero, and the second digital value is a maximum value, $2_N-1$, of the N-bit value, and wherein the multiplexer is configured to select the first digital value when the PWM signal is a logic low level, and select the second digital value when the PWM signal is a logic high level.

3. The electronic circuit of claim 1, wherein the low-pass filter comprises:
   a first input to receive the selected digital output value;
   a second input to receive a digital feedback value;
   an output to provide the N-bit digital speed value; and
   a feedback path to provide an adjusted N-bit digital speed value as the digital feedback value.

4. The electronic circuit of claim 1, wherein the low-pass filter is implemented as a digital circuit, wherein the multiply operation is performed, at least in part, as a left-shift operation and wherein the divide operation is performed, at least in part, as a right-shift operation.

5. The electronic circuit of claim 1, wherein the motor driver comprises:
   a gate driver for providing an associated control signal to each of one or more switching elements coupled to the electronic circuit, the one or more switching elements controlling a voltage applied to each of a plurality of windings of the motor and a current through each of the plurality of windings of the motor.

6. The electronic circuit of claim 5, wherein the one or more switching elements are coupled in a half-bridge circuit comprising at least one branch, each branch associated with a given one of the plurality of windings, each branch comprising a first switching element coupled between a high supply voltage and a switching node of the given winding, and a second switching element coupled between the switching node and a low supply voltage.

7. The electronic circuit of claim 5, further comprising:
a position and speed sensor configured to determine at least one of a speed of a rotor of the motor and an angular position of the rotor of the motor, wherein the gate driver is configured to generate the control signal for each switching element based, at least in part, upon at least one of the determined angular position and the determined speed.

8. A pulse-width modulated (PWM) signal demodulator comprising:
a multiplexer configured to select between a first digital value and a second digital value to provide a selected digital output value, the selection based upon a logic level of a received PWM signal; and
a digital low-pass filter configured to filter the selected digital output value to generate an N-bit digital value associated with a duty cycle of the received PWM signal, wherein the low-pass filter comprises:
a first input to receive the selected digital output value;
a second input to receive a digital feedback value;
an output to provide the N-bit digital value; and
a feedback path to provide an adjusted N-bit digital value as the digital feedback value;
wherein, for a current sample of the selected digital output value, the low-pass filter is configured to:
subtract the digital feedback value from the current selected digital output value to generate a first intermediate value;
subtract the digital feedback value from a previous N-bit digital value to generate a second intermediate value;
subtract the previous N-bit digital value from the digital feedback value to generate a third intermediate value and accumulate the third intermediate value for a window of X samples, wherein X is a positive integer;
add the first intermediate value and the second intermediate value and accumulate the sums for a window of X samples as an accumulated sum value;
multiply the accumulated third intermediate values by a gain factor to generate an intermediate gain value;
add the intermediate gain value and the accumulated sum value to generate an intermediate feedback value;
divide the intermediate feedback value by a time factor to generate the digital feedback value; and
divide the accumulated third intermediate values by a time factor to generate the N-bit digital value.

9. The PWM signal demodulator of claim 8, wherein the first digital value and the second digital value are N-bit values, wherein the first digital value is a minimum value, zero, and the second digital value is a maximum value, $2_N-1$, of the N-bit value, and wherein the multiplexer is configured to select the first digital value when the PWM signal is a logic low level, and select the second digital value when the PWM signal is a logic high level.

10. The PWM signal demodulator of claim 8, wherein the low-pass filter is implemented as a digital circuit, wherein the multiply operation is performed, at least in part, as a left-shift operation and wherein the divide operation is performed, at least in part, as a right-shift operation.

11. A method for digitally demodulating a pulse-width modulated (PWM) signal in a motor control system, the method comprising:

receiving a speed demand signal, the speed demand signal comprising a PWM signal, wherein a duty cycle of the PWM signal is associated with a requested speed of a motor coupled to the electronic circuit;
demodulating the PWM signal and generating an N-bit digital speed value representative of the requested speed of the motor, wherein N is a positive integer;
generating, based at least in part upon the N-bit digital speed value, one or more control signals to operate the motor,
wherein the demodulating comprises:
selecting between a first digital value and a second digital value to provide a selected digital output value, the selection based upon a logic level of the PWM signal; and
filtering the selected digital output value to generate the N-bit digital speed value; generating a digital feedback value based upon an adjusted N-bit digital speed value; and for a current sample of the selected digital output value:
subtracting the digital feedback value from the current selected digital output value to generate a first intermediate value;
subtracting the digital feedback value from a previous N-bit digital speed value to generate a second intermediate value;
subtracting the previous N-bit digital speed value from the digital feedback value to generate a third intermediate value and accumulate the third intermediate value for a window of X samples, wherein X is a positive integer;
adding the first intermediate value and the second intermediate value and accumulating the sums for a window of X samples as an accumulated sum value;
multiplying the accumulated third intermediate values by a gain factor to generate an intermediate gain value;
adding the intermediate gain value and the accumulated sum value to generate an intermediate feedback value;
dividing the intermediate feedback value by a time factor to generate the digital feedback value; and
dividing the accumulated third intermediate values by a time factor to generate the N-bit digital speed value.

12. The method of claim 11, wherein the first digital value and the second digital value are N-bit values, wherein the first digital value is a minimum value, zero, and the second digital value is a maximum value, 2N−1, of the N-bit value, and wherein the first digital value is selected when the PWM signal is a logic low level, and the second digital value is selected when the PWM signal is a logic high level.

13. The method of claim 11, further comprising performing the multiply operation, at least in part, as a left-shift operation and, performing the divide operation, at least in part, as a right-shift operation.

14. The method of claim 11, further comprising:
providing an associated control signal to each of one or more switching elements coupled to the electronic circuit, the one or more switching elements controlling a voltage applied to each of a plurality of windings of the motor and a current through each of the plurality of windings of the motor.

15. A method for demodulating a pulse-width modulated (PWM) signal, the method comprising:

selecting between a first digital value and a second digital value and providing a selected digital output value, the selection based upon a logic level of a received PWM signal; and filtering the selected digital output value and generating an N-bit digital value associated with a duty cycle of the received PWM signal, the N-bit digital value generated based, at least in part, upon the selected digital output value and a digital feedback value; and generating the digital feedback value for a current sample of the selected digital output value by:

subtracting the digital feedback value from the current selected digital output value to generate a first intermediate value;

subtracting the digital feedback value from a previous N-bit digital speed value to generate a second intermediate value;

subtracting the previous N-bit digital speed value from the digital feedback value to generate a third intermediate value and accumulate the third intermediate value for a window of X samples, wherein X is a positive integer;

adding the first intermediate value and the second intermediate value and accumulating the sums for a window of X samples as an accumulated sum value;

multiplying the accumulated third intermediate values by a gain factor to generate an intermediate gain value;

adding the intermediate gain value and the accumulated sum value to generate an intermediate feedback value;

dividing the intermediate feedback value by a time factor to generate the digital feedback value; and dividing the accumulated third intermediate values by a time factor to generate the N-bit digital speed value.

16. The method of claim 15, wherein the first digital value and the second digital value are N-bit values, wherein the first digital value is a minimum value, zero, and the second digital value is a maximum value, $2_N-1$, of the N-bit value, wherein the first digital value is selected when the PWM signal is a logic low level, wherein the second digital value is selected when the PWM signal is a logic high level, wherein the multiply operation is performed, at least in part, as a left-shift operation and wherein the divide operation is performed, at least in part, as a right-shift operation.

* * * * *

UNITED STATES PATENT AND TRADEMARK OFFICE
CERTIFICATE OF CORRECTION

PATENT NO. : 9,843,285 B1
APPLICATION NO. : 15/216891
DATED : December 12, 2017
INVENTOR(S) : Yisong Lu Page 1 of 1

It is certified that error appears in the above-identified patent and that said Letters Patent is hereby corrected as shown below:

In the Specification

Column 6, Line 5, delete "117$f$" and replace with --111$f$--.

Column 6, Line 37, delete "UIN" and replace with --$U_{IN}$--.

In the Claims

Column 11, Line 56, delete "$2_N$-1" and replace with --$2^N$-1--.

Column 12, Line 51, delete "2N-1," and replace with --$2^N$-1,--.

Signed and Sealed this
Seventh Day of May, 2019

Andrei Iancu
*Director of the United States Patent and Trademark Office*